United States Patent
Cader et al.

(10) Patent No.: US 6,889,509 B1
(45) Date of Patent: May 10, 2005

(54) COOLANT RECOVERY SYSTEM

(75) Inventors: Tahir Cader, Pullman, WA (US);
Charles L. Tilton, Colton, WA (US);
Donald D. Tilton, Colton, WA (US);
George J. Wos, Colton, WA (US)

(73) Assignee: Isothermal Systems Research Inc., Clarkston, WA (US)

( * ) Notice: Subject to any disclaimer, the term of this patent is extended or adjusted under 35 U.S.C. 154(b) by 0 days.

(21) Appl. No.: 10/371,403

(22) Filed: Feb. 19, 2003

Related U.S. Application Data

(63) Continuation-in-part of application No. 10/243,683, filed on Sep. 13, 2002, now Pat. No. 6,857,283.

(51) Int. Cl.[7] .................... F25D 17/02; F25D 23/12; H05K 7/20
(52) U.S. Cl. .................... 62/118; 62/119; 62/259.2; 165/104.33; 361/699
(58) Field of Search .................... 62/118, 119, 132, 62/171, 64, 259.2; 165/104.33, 908; 236/75; 239/132.5; 257/715; 361/699, 689, 698, 361/719, 721

(56) References Cited

U.S. PATENT DOCUMENTS

| | | | |
|---|---|---|---|
| 3,774,677 A | 11/1973 | Antonetti et al. ............. 165/39 |
| 4,485,367 A * | 11/1984 | Hashizume ................... 336/57 |
| 4,723,415 A * | 2/1988 | Chen ............................. 62/169 |
| 4,897,762 A * | 1/1990 | Daikoku et al. ............ 361/689 |
| 5,358,615 A | 10/1994 | Grant et al. ........... 204/192.15 |
| 5,475,317 A | 12/1995 | Smith .......................... 324/761 |
| 5,584,971 A | 12/1996 | Komino ................. 204/192.13 |
| 5,859,763 A | 1/1999 | Nam et al. ................... 361/699 |
| 5,907,473 A * | 5/1999 | Przilas et al. ............... 361/699 |
| 6,108,201 A | 8/2000 | Tilton et al. ................ 361/689 |
| 6,176,098 B1 | 1/2001 | Moriguchi .................. 62/259.2 |
| 6,201,467 B1 | 3/2001 | Winterer et al. .............. 338/42 |
| 6,288,561 B1 | 9/2001 | Leedy .......................... 324/760 |
| 6,315,872 B1 | 11/2001 | Pavate et al. .......... 204/192.15 |
| 6,326,696 B1 | 12/2001 | Horton et al. ............... 257/777 |
| 6,421,240 B1 | 7/2002 | Patel ........................... 361/699 |
| 6,445,200 B2 | 9/2002 | Haseyama ................... 324/755 |
| 6,571,569 B1 * | 6/2003 | Rini et al. .................. 62/259.2 |
| 6,604,370 B2 | 8/2003 | Bash et al. ................... 62/171 |
| 2002/0005729 A1 | 1/2002 | Leedy .......................... 324/760 |
| 2002/0014894 A1 | 2/2002 | Yonezawa et al. .......... 324/760 |

(Continued)

FOREIGN PATENT DOCUMENTS

EP  0 480 750  4/1992

*Primary Examiner*—Chen-Wen Jiang
(74) *Attorney, Agent, or Firm*—Michael S. Neustel

(57) ABSTRACT

A coolant recovery system for reducing coolant loss within thermal management systems. The coolant recovery system includes a thermal management unit having a spray chamber and a coolant recovery chamber, a first cooling coil within the coolant recovery chamber, and a chilled water supply fluidly connected to the first cooling coil. The coolant is sprayed upon the electronic device within the spray chamber and then is collected into the coolant recovery chamber for thermal conditioning. A removable chamber may be removably positioned within the spray chamber. In an alternative embodiment, a central unit may be connected to a plurality of thermal management units.

1 Claim, 10 Drawing Sheets

U.S. PATENT DOCUMENTS

| | | | |
|---|---|---|---|
| 2002/0047116 A1 | 4/2002 | Pavate et al. | 257/44 |
| 2002/0075024 A1 | 6/2002 | Fredeman et al. | 324/760 |
| 2002/0113142 A1 | 8/2002 | Patel et al. | 239/128 |
| 2002/0114140 A1 | 8/2002 | Bash et al. | 361/719 |
| 2002/0135389 A1 | 9/2002 | Melgaard et al. | 324/760 |
| 2002/0144899 A1 | 10/2002 | Arcella et al. | 204/296 |

* cited by examiner

COOLANT RECOVERY SYSTEM

CROSS REFERENCE TO RELATED APPLICATIONS

I hereby claim benefit under Title 35, United States Code, Section 120 of U.S. patent application Ser. No. 10/243,683 filed Sep. 13, 2002 entitled "Semiconductor Burn-In Thermal Management System". This application is a continuation-in-part of the Ser. No. 10/243,683 application filed on Sep. 13, 2002 now U.S. Pat. No. 6,857,283. The Ser. No. 10/243,683 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to electronics cooling systems and more specifically it relates to a coolant recovery system for reducing coolant loss within thermal management systems.

2. Description of the Related Art

Thermal management systems for electronic systems have been in use for years. Thermal management systems are used in various applications such as but not limited to semiconductor burn-in, server computers, personal computers and workstations, rack mount servers, diagnostics, and large telecommunications and computing facilities. Conventional thermal management systems utilized today are comprised of, for example, either air-cooled enclosures, or fluid-cooled cold plates. Upcoming technologies include refrigeration systems or other two-phase based technologies.

Modern electronic devices have increased thermal management requirements. Spray cooling is being adopted today as the most efficient option for thermally managing electronic systems. U.S. Pat. No. 5,220,804 entitled High Heat Flux Evaporative Spray Cooling to Tilton et al. describes the earlier versions of spray cooling technology. U.S. Pat. No. 6,108,201 entitled Fluid Control Apparatus and Method for Spray Cooling to Tilton et al. also describes the usage of spray cooling technology to cool a printed circuit board. Spray cooling may be performed locally (i.e. where the chip is sprayed directly) or globally (i.e. where the chip and surrounding electronics/boards are also sprayed).

Various methods of spray cooling thermal management may be employed for the semiconductors and other electronic devices. For adequately low heat fluxes, it may be appropriate to cool the electronic devices through purely forced convection (i.e. no effective evaporation of the coolant occurs). For intermediate heat fluxes, it may be appropriate to utilize a combination of forced convection and phase change heat transfer (i.e. the latter method resulting in evaporation of the coolant). For the highest level of heat fluxes, it may be appropriate to optimize purely on phase change heat transfer. Expensive dielectric coolants are the most commonly utilized liquid coolants utilized in spray cooling thermal management systems today thereby making vapor recovery increasingly important.

In most spray cooling applications, a certain volume of coolant is changed to vapor. It is important in a burn-in application to rapidly remove the burn-in boards to reduce costly equipment downtime. However, costly dielectric coolant is lost through vapor loss that increases the overall cost of spray cooling thermal management. Another example is the thermal management of servers employed in data centers where the processors or entire servers may need to be removed for maintenance. In any application of spray cooling thermal management, coolant vapor loss is a significant issue. Hence, there is a need for technology that will mitigate the volume of coolant loss in a spray cooling thermal management system.

While conventional thermal management systems may be suitable for the particular purpose to which they address, they are not as suitable for reducing coolant loss. Conventional spray cooling thermal management systems may have significant coolant vapor loss, which would increase the thermal management costs.

In these respects, the coolant recovery system according to the present invention substantially departs from the conventional concepts and designs of the prior art, and in so doing provides a system primarily developed for the purpose of reducing coolant loss within thermal management systems.

BRIEF SUMMARY OF THE INVENTION

In view of the foregoing disadvantages inherent in the known types of thermal management systems now present in the prior art, the present invention provides a new coolant recovery system construction wherein the same can be utilized for providing an effective thermal management system capable of maintaining a desired semiconductor temperature during a burn-in cycle.

The general purpose of the present invention, which will be described subsequently in greater detail, is to provide a new coolant recovery system that has many of the advantages of the thermal management systems mentioned heretofore and many novel features that result in a new coolant recovery system which is not anticipated, rendered obvious, suggested, or even implied by any of the prior art semiconductor burn-in systems, either alone or in any combination thereof.

To attain this, the present invention generally comprises a thermal management unit having a spray chamber and a coolant recovery chamber, a first cooling coil within the coolant recovery chamber, and a chilled water supply fluidly connected to the first cooling coil. The coolant is sprayed upon the electronic device within the spray chamber and then is collected into the coolant recovery chamber for thermal conditioning. A removable chamber may be removably positioned within the spray chamber. In an alternative embodiment, a central unit may be connected to a plurality of thermal management units.

The vapor recovery schemes of the present invention rely on the ability to rapidly evaporate liquid coolant that remains upon the burn-in boards, as well as other components, at the completion of a burn-in cycle. Unique design features are employed that minimize coolant hang-up, and facilitate coolant evaporation. For example, all surfaces are sloped to the extent possible in order to facilitate coolant return to the vapor recovery chamber. Another example is the use of design rules that prevent, to the extent possible, the inclusion of tight clearances that would increase the difficulty of evaporating the coolant. Another example is the use of non-wetting surfaces such as but not limited TEFLON to prevent coolant buildup and accumulation.

There has thus been outlined, rather broadly, the more important features of the invention in order that the detailed description thereof may be better understood and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a coolant recovery system that will overcome the shortcomings of the prior art devices.

A second object is to provide a coolant recovery system that reduces coolant loss within thermal management systems.

Another object is to provide a coolant recovery system that reduces the costs of operating a thermal management system utilizing coolant.

An additional object is to provide a coolant recovery system that is energy efficient and flexible.

A further object is to provide a coolant recovery system that may be utilized within standalone or central thermal management systems.

Another object is to provide a coolant recovery system that may be utilized with local or global spray cooling applications.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
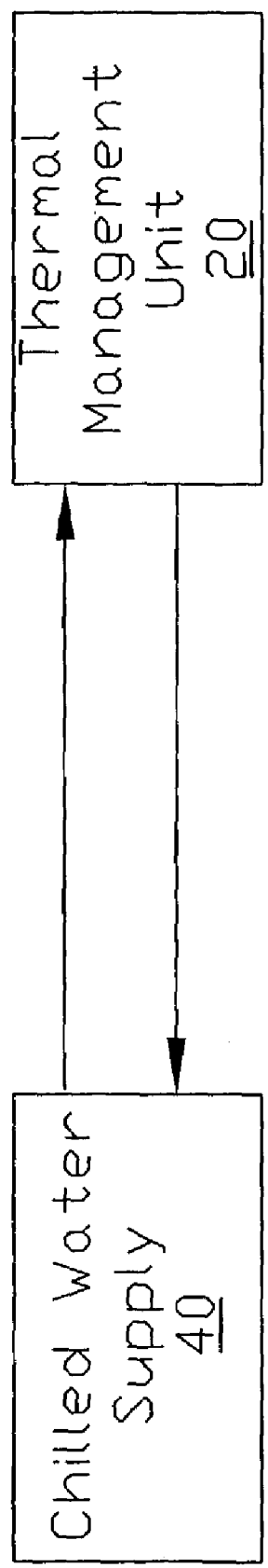
FIG. 1 is a block diagram of a standalone embodiment of the present invention.

Turning now descriptively to the drawings, in which similar reference characters denote similar elements throughout the several views, FIGS. 1 through 10 illustrate a coolant recovery system 10, which comprises a thermal management unit 20 having a spray chamber 22 and a coolant recovery chamber 24, a first cooling coil 30 within the coolant recovery chamber 24, and a chilled water supply 40 fluidly connected to the first cooling coil 30. The coolant is sprayed upon the electronic device within the spray chamber 22 and then is collected into the coolant recovery chamber 24 for thermal conditioning. A removable chamber 80 may be removably positioned within the spray chamber 22. In an alternative embodiment, a central unit 50 may be connected to a plurality of thermal management units 20.

B. Thermal Management Unit

The thermal management unit 20 contains the electronic devices, such as a semiconductor 14, to be thermally managed. The thermal management unit 20 may utilize various liquid-based thermal management techniques such as but not limited to spray cooling and cold-plate technologies. The thermal management unit 20 may be utilized in various applications such as but not limited to semiconductor 14 burn-in devices, server computers, personal computers and workstations, rack mount servers, diagnostics, and large telecommunications and computing facilities.

Figure 2:
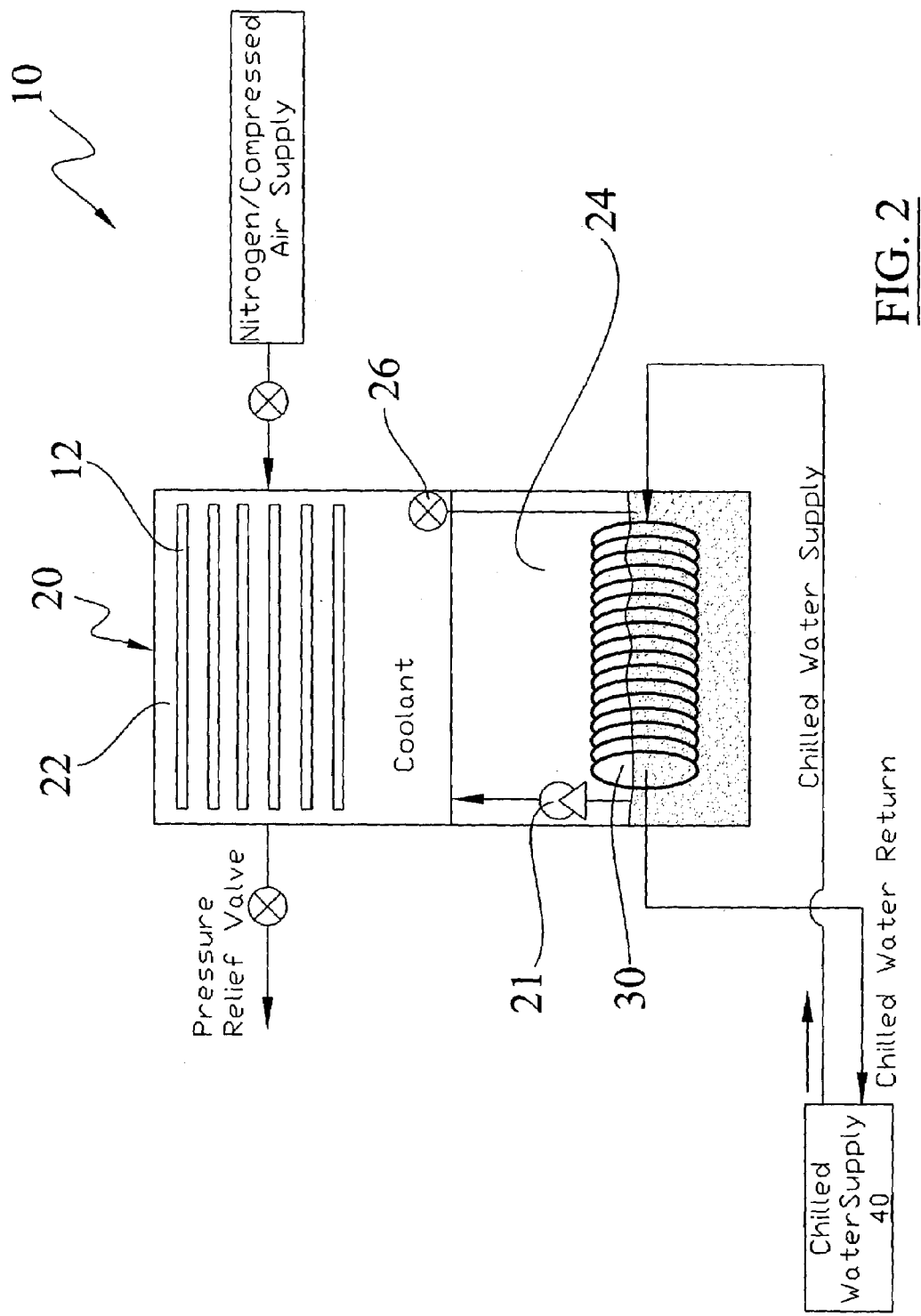
FIG. 2 is a diagram of the standalone embodiment of the present invention.

FIG. 2 illustrates an exemplary thermal management unit 20 utilized for burn-in of semiconductors 14. The thermal management unit 20 has a spray chamber 22 that is capable of receiving one or more burn-in boards 12. The spray chamber 22 may be configured for local or global spray cooling of electronic devices. The spray chamber 22 may be comprised of any structure capable of housing a burn-in board 12 which are commonly utilized within the burn-in industry or other units not utilized within the burn-in industry.

The spray chamber 22 preferably has an opening and a door for selectively closing and sealing the opening as is conventional with spray enclosures utilized within the burn-in industry. The spray chamber 22 preferably has a structure for receiving and supporting one or more burn-in boards 12 in a desired position with respect to the corresponding spray assembly spray units 60. It can be appreciated that the spray units 60 and the burn-in boards 12 may be stacked within the interior cavity of the spray chamber 22 depending upon the total number of burn-in boards 12 to be utilized simultaneously. It can be appreciated that the spray chamber 22 may have various structures and configurations not illustrated within FIG. 2 of the drawings that may be suitable for usage with the present invention.

C. Removable Chamber

Figure 7:
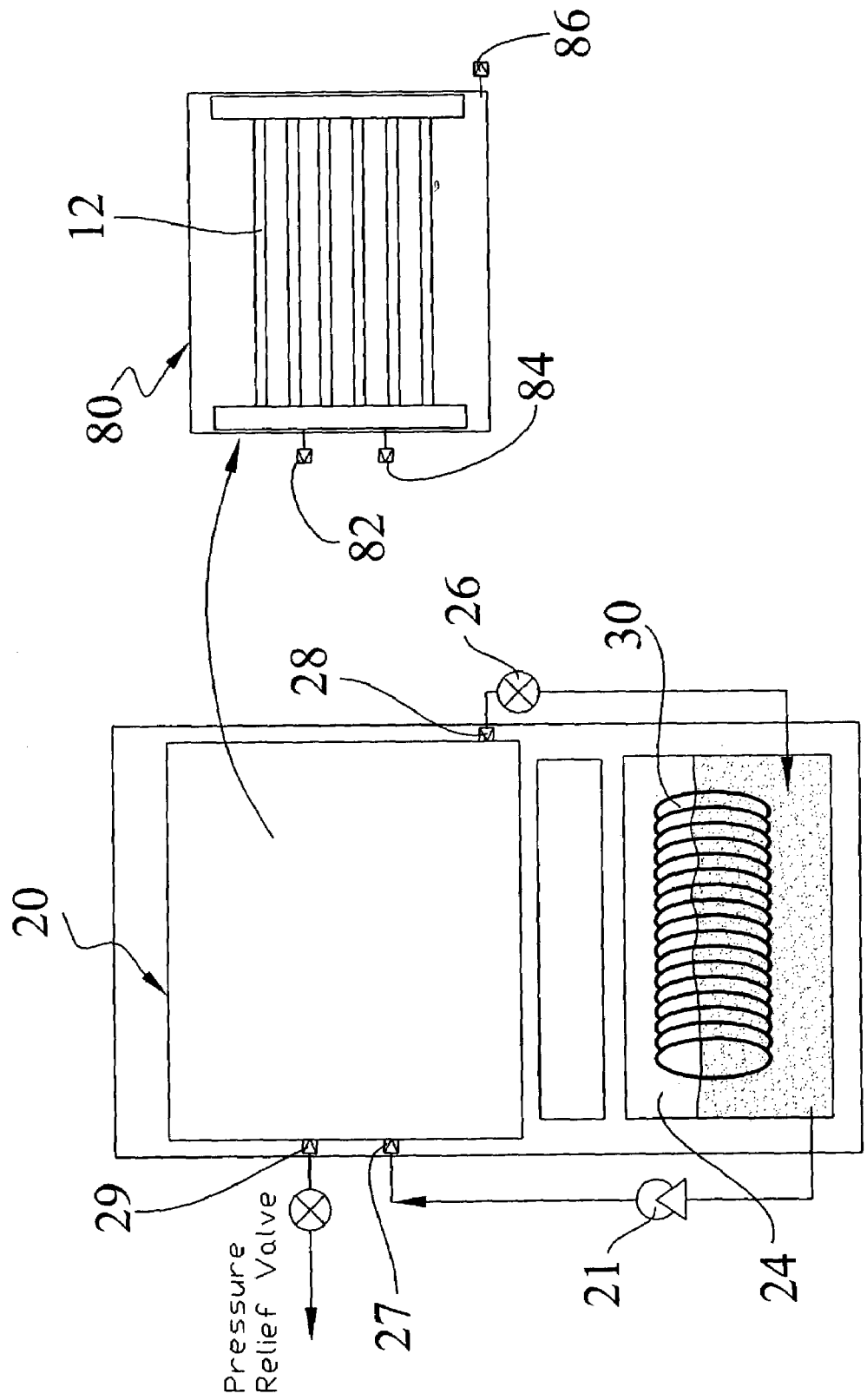
FIG. 7 is a diagram of a removable chamber removably positionable within the thermal management unit.

As shown in FIG. 7 of the drawings, the present invention may also be configured to receive a self-contained removable chamber 80 containing a plurality of arrays of spray units 60 for allowing quick changing of the semiconductors 14 thereby increasing the operational time of the burn-in system. The removable chamber 80 is capable of receiving one or more burn-in boards 12.

The thermal management unit 20 includes a first coupler 27, a second coupler 28 and a third coupler 29 that removably mate with a first chamber coupler 84, a second chamber coupler 86 and a third chamber coupler 82 extending from the removable chamber 80. The third chamber coupler 82 and the third coupler 29 may mate to connect to the pressure relief valve as shown in FIG. 7 of the drawings. The first chamber coupler 84 and the first coupler 27 may mate to connect to the coolant supply as shown in FIG. 7 of the drawings. The second chamber coupler 86 and the second coupler 28 may mate to connect to the purge valve 26 as shown in FIG. 7 of the drawings. Various electronic sensors within the removable chamber 80 may also be connected through an electrical connection unit.

One of the benefits of the removable chamber 80 is the ability to pre-load the removable chamber 80 with semiconductors 14. Another benefit of the removable chamber 80 is to allow for unloading offline thereby significantly decreasing the downtime of the thermal management unit 20. In other words, once the burn-in cycle is completed, the fully loaded removable chamber 80 is removed and replaced with a fully pre-loaded removable chamber 80. The first removable chamber 80 is then taken to a vapor recovery station where the removable chamber 80 is evacuated, all vapor recovered, then the semiconductors 14 removed from the burn-in boards 12. The vapor recovery station is similar to a thermal management unit 20 in that it allows for the evaporation and recovery of the coolant from the removable chamber 80, burn-in board 12 and semiconductors 14. The removable chamber 80 can then be pre-loaded and the process repeated. This reduces downtime and reduces overall costs of operating the thermal management unit 20. This concept may be utilized with the stand-alone and central approaches.

D. Coolant Recovery Chamber

FIGS. 2 and 7 illustrate the coolant recovery chamber 24 within the thermal management unit 20. The coolant recovery chamber 24 receives the heated coolant after the coolant has been applied to the electronic device being thermally managed. A purge valve 26 within the spray chamber 22 allows for collected coolant within the spray chamber 22 to be transferred to the coolant recovery chamber 24 by a pump, fluid pressure or gravity.

A first cooling coil 30 is positioned within the coolant recovery chamber 24. The first cooling coil 30 is fluidly connected to a chilled water supply 40 for reducing the temperature of the collected coolant to a desired temperature. The first cooling coil 30 may be partially or fully submerged within the coolant as shown in FIGS. 2 and 7 of the drawings. If a portion of the first cooling coil 30 is expected above the coolant surface, the first cooling coil 30 may assist in condensing any coolant vapor within the coolant recovery chamber 24. The first cooling coil 30 may have various structures and configurations commonly utilized for cooling coils.

A first pump 21 is fluidly connected to the coolant recovery chamber 24 for drawing the thermally conditioned fluid from the coolant recovery chamber to the spray units 60 within the spray chamber 22. The thermally conditioned fluid is then sprayed upon the electronic devices and the collection/thermal conditioning processes are repeated.

The chilled water supply 40 may be comprised of any fluid in addition to water that allows for the transfer of heat from coolant within the coolant recovery chamber 24. The chilled water supply 40 may be provided by the process chilled water (PCW) loop which is normally available within high volume manufacturing (HVM) facilities. Through the liquid-to-liquid heat exchange, the chilled water supply 40 is utilized to thermally condition the coolant to a desired temperature.

F. Central Unit

Figure 3:
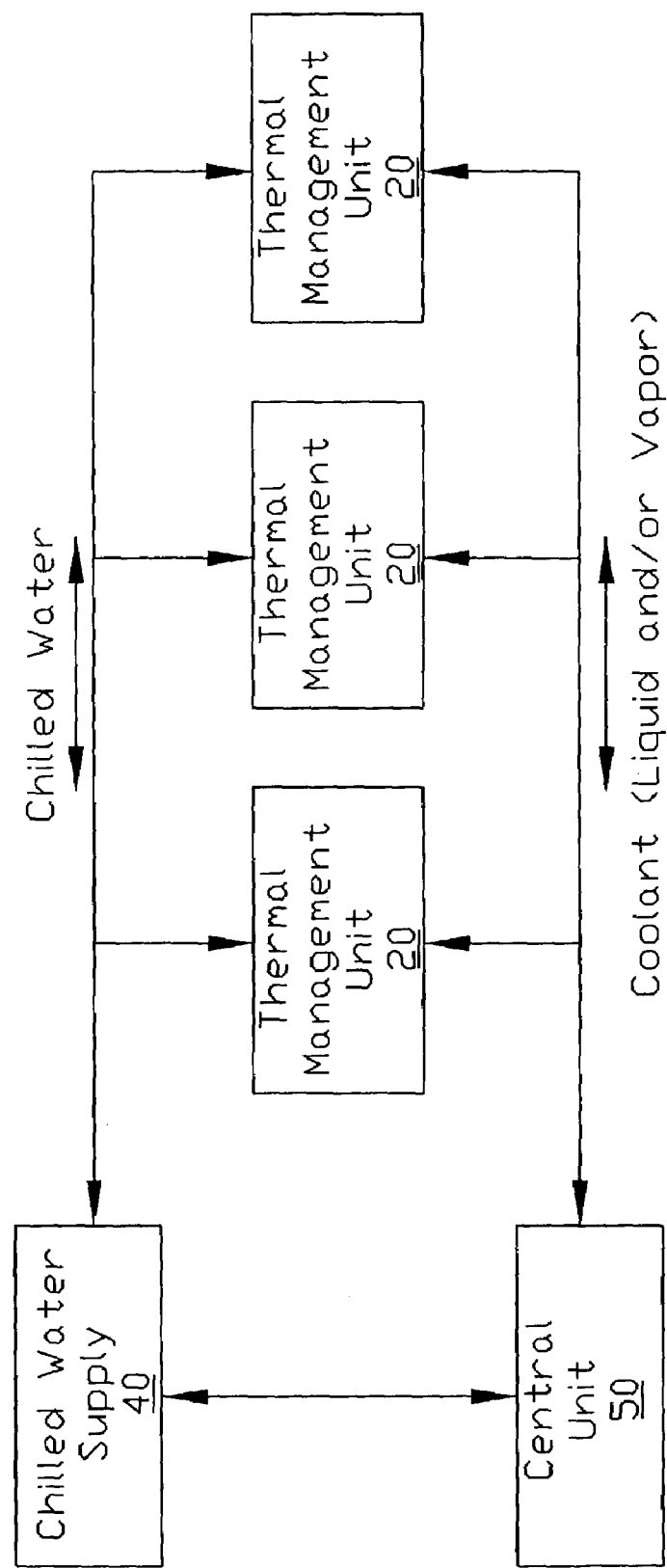
FIG. 3 is a block diagram of a central management embodiment of the present invention having a central unit with a plurality of satellite thermal management units.

FIGS. 3 through 6 illustrate a centralized thermal management system. FIG. 3 illustrates the usage of a central unit 50 fluidly connected to the chilled water supply 40 and to one or more thermal management units 20. The chilled water supply 40 is further fluidly connected to each of the thermal management units 20 for providing thermal conditioning of the coolant within the thermal management unit 20. The central unit 50 may be a stationary device or a portable device utilizing wheels or other movable structures to allow for transportation to individual thermal management units 20.

The usage of a mobile central unit 50 allows for the recovery of coolant at various remote thermal management units 20 thereby reducing the overall cost of each individual thermal management unit 20 since a coolant recovery structure is not required within the thermal management units 20.

Figure 4:
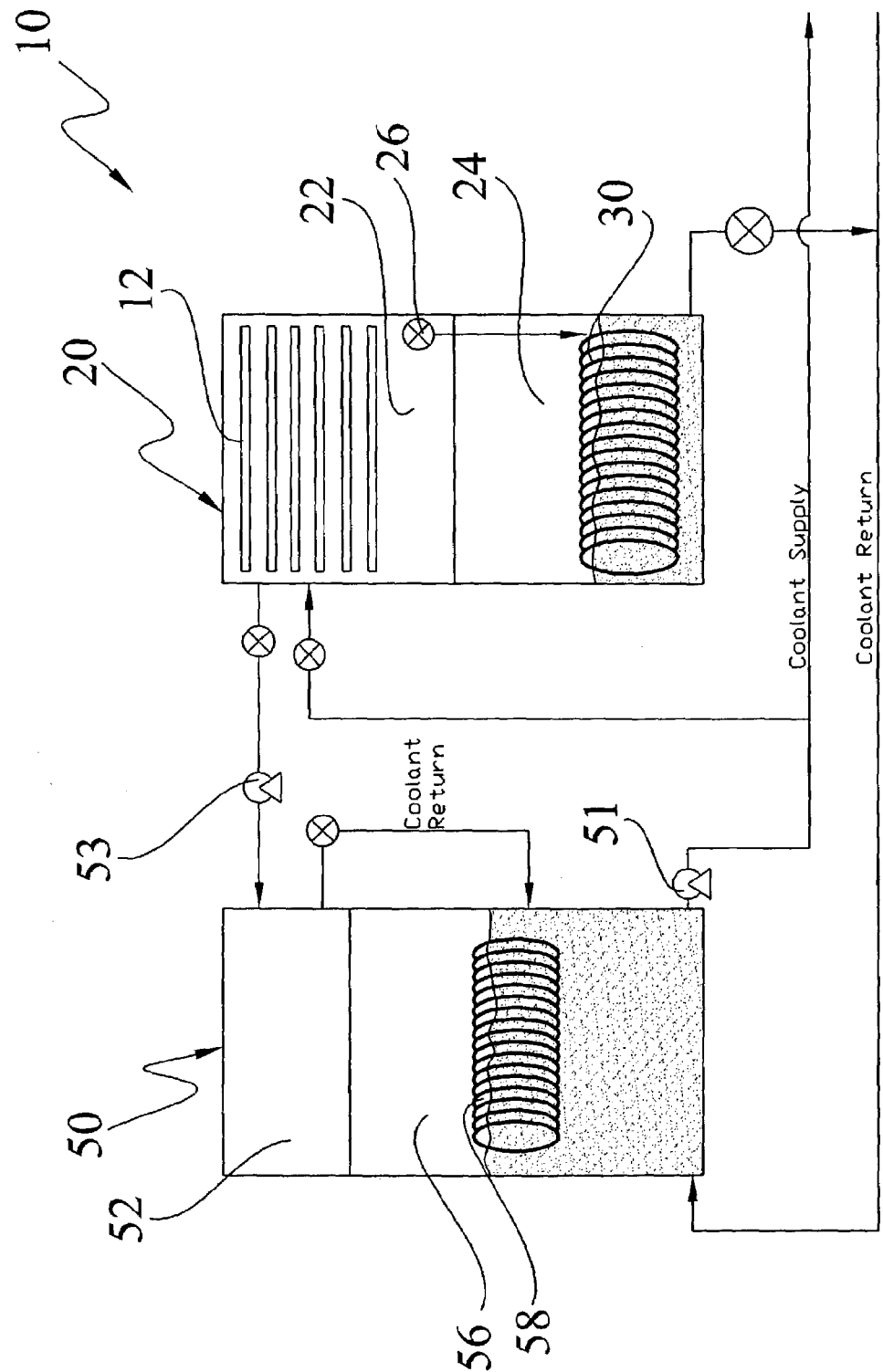
FIG. 4 is a diagram of the central management embodiment of the present invention.
Figure 5:
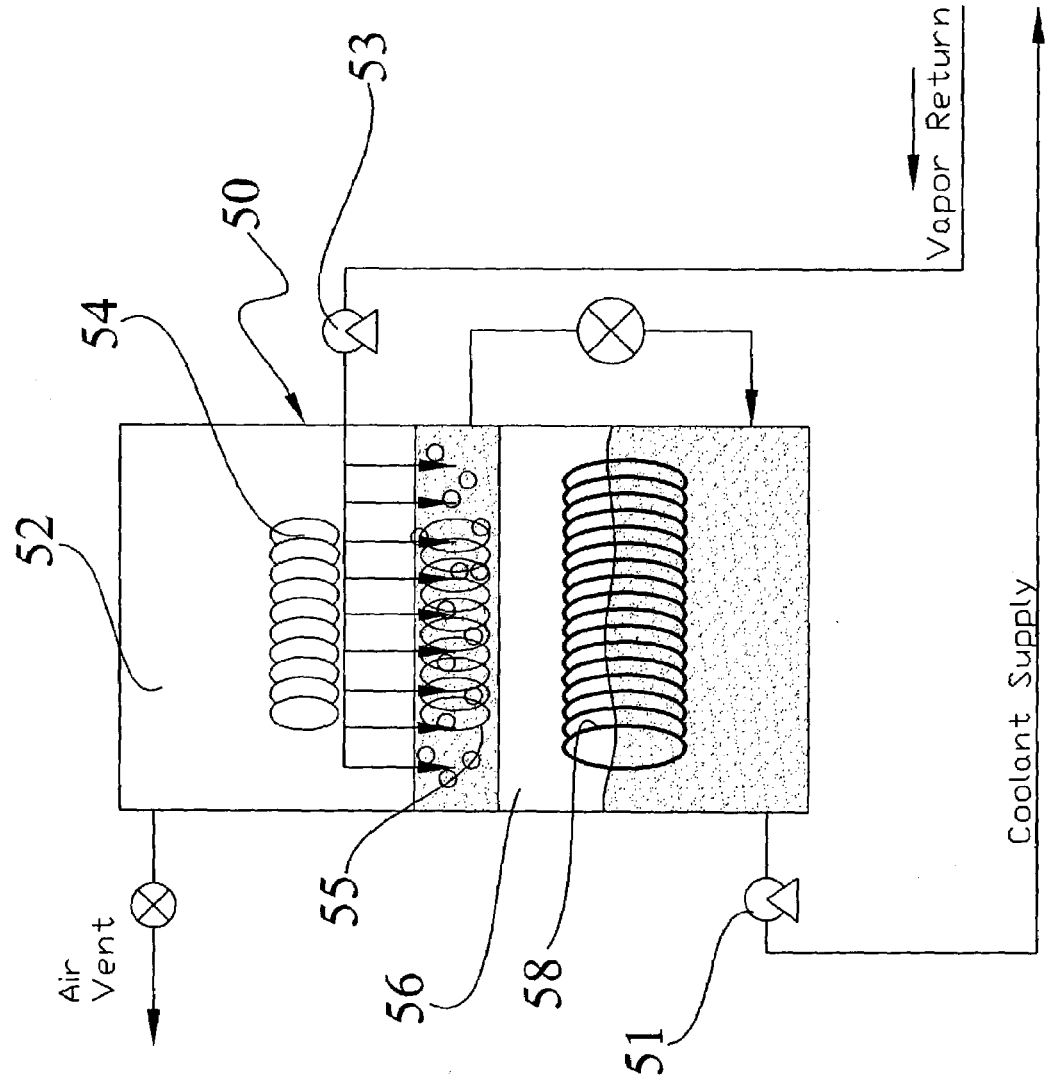
FIG. 5 is a diagram of the central unit utilizing chilled water.
Figure 6:
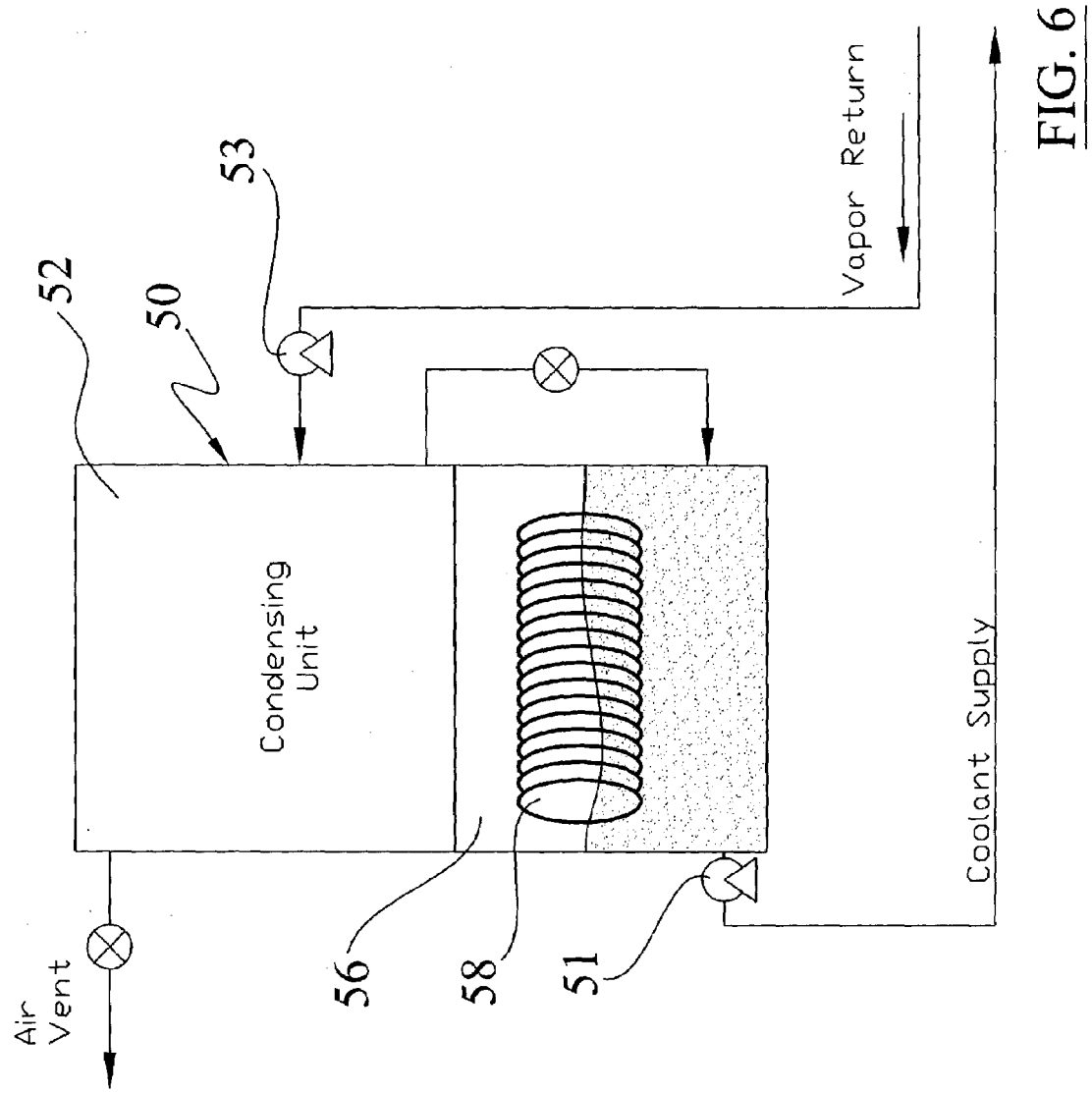
FIG. 6 is a diagram of the central unit utilizing a chiller to condition refrigerant.

The central unit 50 is best illustrated in FIG. 5 of the drawings having a condensing unit 52 and a collection chamber 56. The condensing unit 52 and the collection chamber 56 are fluidly connected by a fluid recovery line having a valve integrally positioned within as shown in FIGS. 4 through 6 of the drawings. The condensing unit 52 preferably has a condensing coil positioned within an upper portion of the condensing unit 52 for condensing vaporized coolant as shown in FIG. 5 of the drawings.

A second cooling coil 55 is positioned within the lower portion of the condensing unit 52 for thermally conditioning collected/condensed coolant. The condensing coil and the second cooling coil 55 are preferably fluidly connected to the chilled water supply 40.

A manifold is fluidly connected to a vapor return line where a third pump 53 forces the coolant vapor into the manifold as shown in FIG. 5 of the drawings. The manifold preferably has a significantly larger cross section than the vapor return pipe thereby allowing the vapor velocity to be significantly reduced.

The manifold disperses the coolant vapor directly into the chilled bath of coolant within the condensing unit 52. The coolant vapor bubbles throughout the chilled bath of coolant and is condensed to a liquid state. The condensing coils 54 within the upper portion of the condensing unit 52 condense any coolant vapor that escapes the coolant bath. One or more large cross-sectional area valves allow for the slow escape of air and other gases outside of the condensing unit 52.

The collected coolant is then transferred to the collection chamber 56 of the central unit 50 for further thermal conditioning as shown in FIG. 5 of the drawings. The collection chamber 56 includes a third cooling coil 58 positioned within that is fluidly connected to the chilled water supply 40. The third cooling coil 58 thermally conditions the collected coolant within the collection chamber 56 prior to the second pump 51 fluidly pumping the coolant back into the system through the coolant supply line.

G. Spray Units

Figure 8:
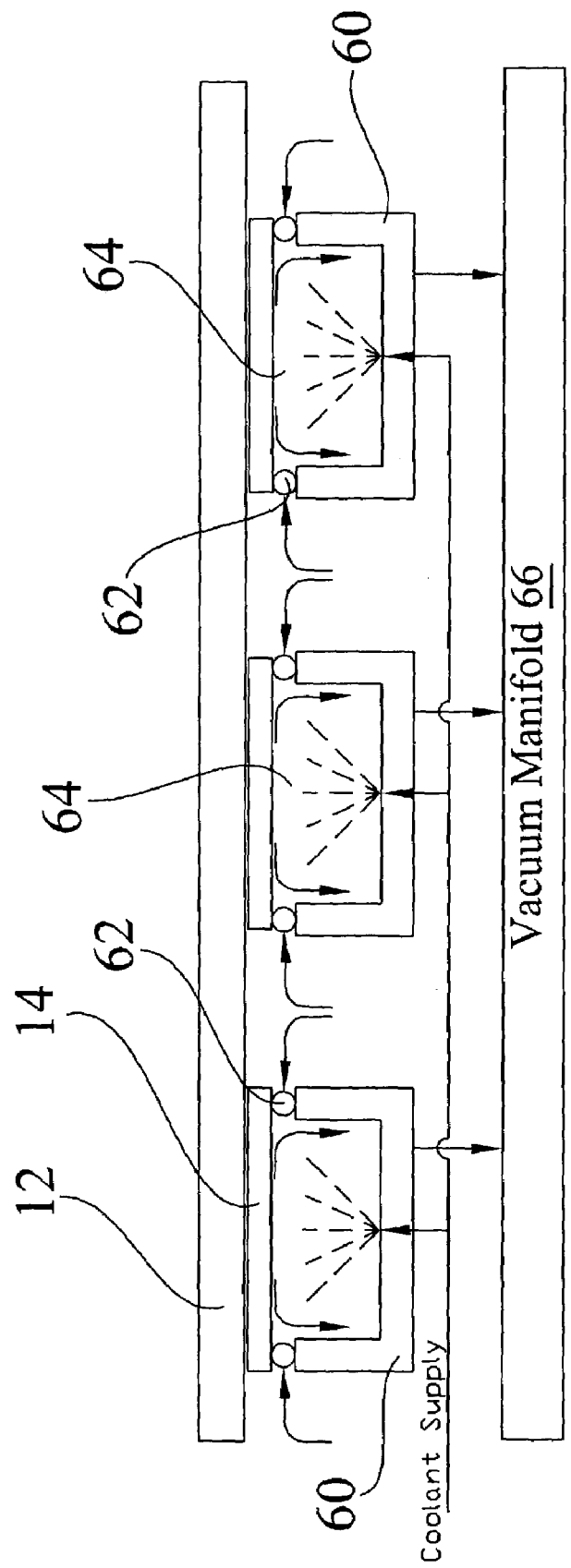
FIG. 8 illustrates a first embodiment of the spray unit having a seal structure.

FIG. 8 illustrates a spray unit 60 that has reduced vapor loss. The spray unit 60 utilizes a spray housing for each individual semiconductor 14 that is sealed by a seal structure 62. The seal structure 62 may be comprised of various sealing structures such as O-rings and the like.

A vacuum manifold 66 is fluidly connected to each spray housing thereby creating a vacuum within the spray cavity 64 of the spray housings that draws the liquid and vapor coolant from the interior thereof. The vacuum manifold 66 then transfers the vapor and liquid coolant to the central unit 50 for condensing and thermal conditioning.

Figure 9:
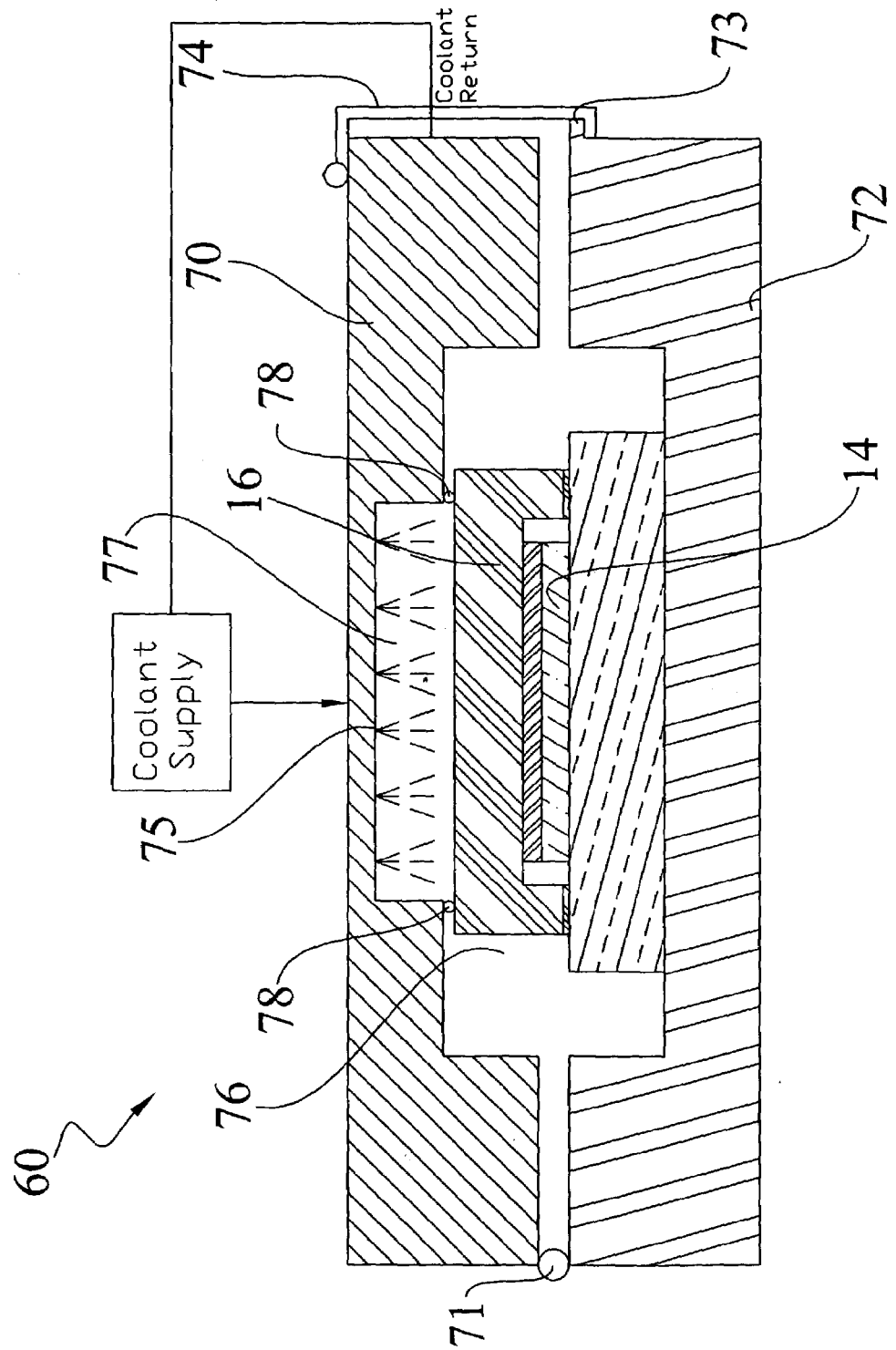
FIG. 9 illustrates a second embodiment of the spray unit having a seal structure.

FIG. 9 illustrates an alternative embodiment of the spray units 60 wherein an upper member 70 and a lower member 72 are pivotally attached by a hinge 71. The upper member 70 and the lower member 72 define an interior cavity 76 that receives the semiconductor 14. A clip member 74 extending from the upper member 70 or other engaging structure selectively engages a lip 73 of the lower member 72 thereby retaining the upper member 70 adjacent the lower member 72.

The upper member 70 defines a spray area 77 about the semiconductor 14 having a heat sink 16 or without a heat sink 16. A seal member 78 is attached to the upper member 70 about the spray area 77 for sealably engaging the surface of integrated heat sink of the semiconductor 14. The coolant supply is sprayed upon the semiconductor 14 through atomizers 75. A coolant return line is fluidly connected to the spray area 77 and thereafter returns the coolant and vapor to the coolant supply which is thermally conditioned by the central unit 50.

Figure 10:
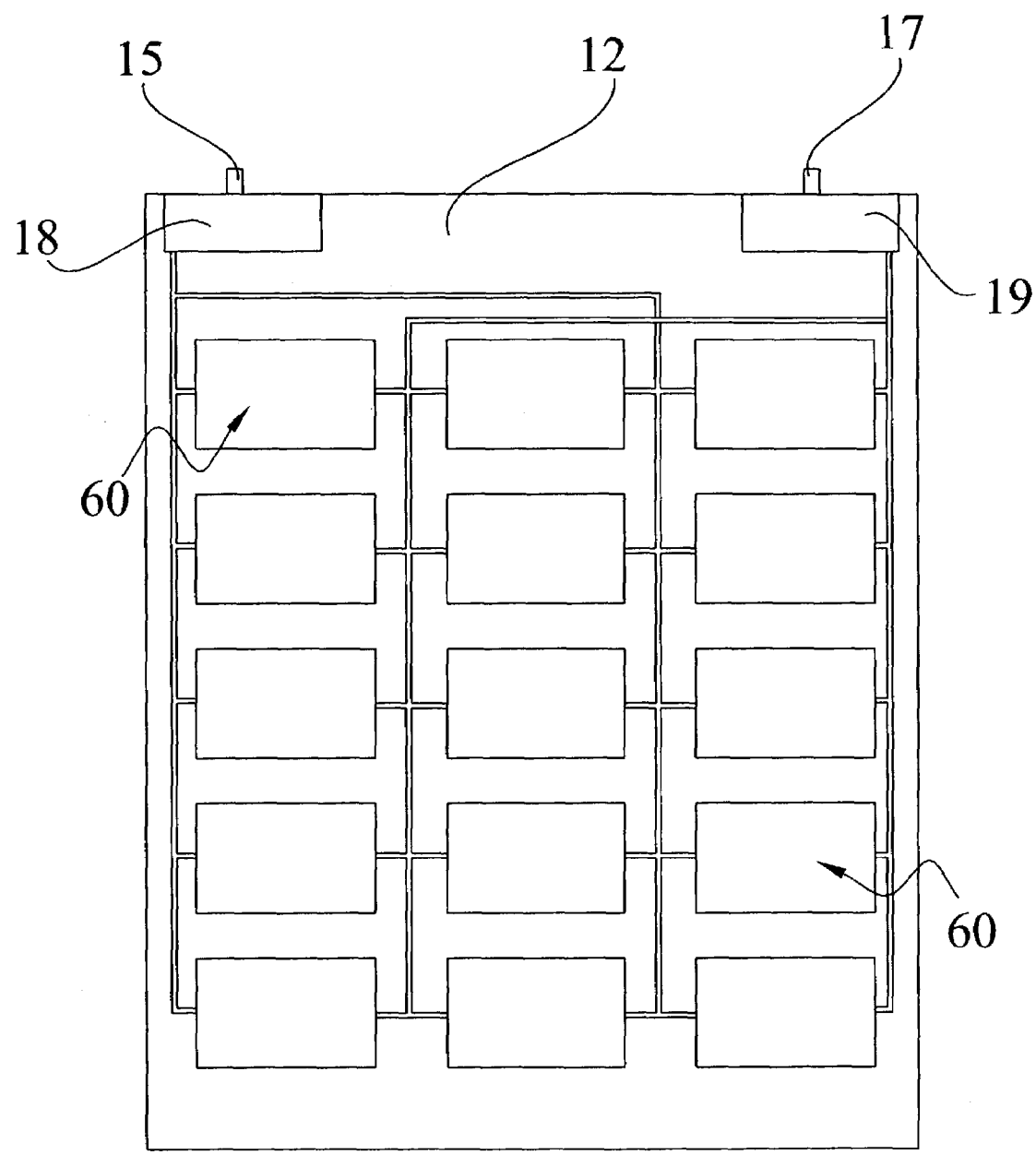
FIG. 10 is a top view of a removable burn-in board with the spray units fluidly mounted upon thereof.

FIG. 10 illustrates an alternative embodiment where the burn-in board 12 has the spray units 60 integrally positioned within. The spray units 60 are fluidly connected to a supply manifold 18 and a return manifold 19 for providing the coolant to the spray units 60. The supply manifold 18 and the return manifold 19 are fluidly connected to a supply coupler 15 and a return coupler 17 for allowing removably fluid connection with corresponding couplers within the thermal management unit. The semiconductors 14 are loaded into the sockets of the burn-in board 12 off-line, then loaded into the thermal management unit 20.

After a burn-in cycle, the fully loaded burn-in board 12 is removed and replaced with a fully pre-loaded burn-in board 12. The first burn-in board 12 is taken to a vapor recovery station (the same may be applied for the removable chamber 80), and cycle continued. This approach can be used for the stand-alone or central versions of the present invention.

H. Control Unit

The control unit (not shown) may be comprised of various electronic devices capable of communicating with and controlling the burn-in board 12, the thermal management unit 20, the first pump 21, the second pump 51 and the third pump 53, chilled water supply 40, central unit 50, spray units 60, purge valve 26 and valves. The control unit may be comprised of a computer or other electronic device capable of receiving and storing commands.

The control unit may communicate with the external electrical devices such as but not limited to electrically or via communications signal. The control unit may be programmed to operate the external devices at various operating levels such as but not limited to controlling the temperature of the fluid within the coolant recovery chamber 24, controlling the fluid pressure and flow rate emitted by the first pump 21, controlling the spray pattern and flow of the spray units 60, and controlling the flow of fluid to the spray units 60. It can be appreciated that more than one control unit may be utilized to control one or more of the components of the present invention.

I. Vapor Recovery—Method 1

There are several methods for recovering the vaporized coolant. The first method of vapor recovery is accomplished at the thermal management unit 20 as shown in FIG. 2 of the drawings.

At the completion of burn-in or other thermal management procedure, the first cooling coil 30 within the coolant recovery chamber 24 is operated at maximum cooling capacity while the spray chamber 22 is allowed to communicate with the reservoir. The low temperature creates a vacuum within the coolant recovery chamber 24 and the spray chamber 22 thereby vaporizing any liquid coolant remaining within the spray chamber 22. It can be appreciated that there are many other systems for creating a vacuum with the spray chamber 22 such as by the usage of a pump or other vacuum creation system.

Compressed dry air or nitrogen is then introduced into the spray chamber 22 thereby forcing the coolant vapor downwardly into the coolant recovery chamber 24 for condensing. This process may be repeated a desired number of times until the coolant within the spray chamber 22 is vaporized and the coolant vapor is removed from the spray chamber 22. At the completion of this process, the valve within the coolant recovery line connecting the spray chamber 22 and the coolant recovery chamber 24 is closed.

J. Vapor Recovery—Method 2

The second method is illustrated in FIG. 5 of the drawings using the central unit 50. The coolant vapor and other gases are transferred by a third pump 53 into a distribution manifold that has a larger diameter than the delivery pipe thereby significantly reducing the vapor velocity after the vapor has entered the manifold.

The vapor is then bubbled through a chilled bath of coolant thereby condensing the coolant vapor and allowing the other gases to escape into the headspace. A second cooling coil 55 positioned within the lower portion of the condensing unit 52 that is fluidly connected to the chilled water supply 40 maintains a desirable temperature within the coolant. The cooling coils may receive chilled water from the chilled water supply 40 as shown in FIG. 5 or refrigerant conditioned by a chiller as shown in FIG. 6.

A condensing coil 54 fluidly connected to the chilled water supply 40 is positioned within the headspace of the condensing unit 52 thereby condensing any coolant vapor that escapes from the chilled bath of coolant as shown in FIG. 5 of the drawings. The condensed coolant is then returned to the chilled bath of coolant after condensation.

One or more large cross-sectional area valves within the condensing unit 52 allow the condensing unit 52 to fluidly communicate with the atmosphere thereby allowing the gases within the headspace to escape at a relatively low velocity without entraining significant amounts of coolant vapor. The recovered coolant is then transferred to the collection chamber 56 of the central unit 50 for further thermal conditioning by a recovered coolant line as shown in FIG. 5 of the drawings.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A process of operating a coolant recovery system within an electronic device thermal management system, said process comprising the steps of:

providing a thermal management unit having a thermal management chamber, a coolant recovery chamber and a heat exchanger within said coolant recovery chamber for thermally conditioning coolant, wherein said thermal management chamber is fluidly connected to said coolant recovery chamber; and maintaining a volume of coolant into said coolant recovery chamber having a coolant level, wherein said coolant level is below a top of said heat exchanger and above a bottom of said heat exchanger.

* * * * *